United States Patent
Ke et al.

(10) Patent No.: US 9,385,274 B2
(45) Date of Patent: Jul. 5, 2016

(54) PATTERNED OPTO-ELECTRICAL SUBSTRATE AND METHOD FOR MANUFACTURING THE SAME

(71) Applicant: Kinik Company, Taipei (TW)

(72) Inventors: Wen-Cheng Ke, Taipei (TW); Wei-Kuo Chen, Hsinchu (TW); Fwu-Yih Houng, Hsinchu County (TW); Chia-Che Ho, Hsinchu County (TW)

(73) Assignee: KINIK COMPANY, Taipei (TW)

( * ) Notice: Subject to any disclaimer, the term of this patent is extended or adjusted under 35 U.S.C. 154(b) by 252 days.

(21) Appl. No.: 14/104,547

(22) Filed: Dec. 12, 2013

(65) Prior Publication Data

US 2015/0076505 A1    Mar. 19, 2015

(30) Foreign Application Priority Data

Sep. 16, 2013    (TW) ............................. 102133449 A

(51) Int. Cl.

| H01L 21/00 | (2006.01) |
|---|---|
| H01L 31/0256 | (2006.01) |
| H01L 33/22 | (2010.01) |
| H01L 33/12 | (2010.01) |
| H01L 33/32 | (2010.01) |
| H01L 33/00 | (2010.01) |
| H01L 21/02 | (2006.01) |

(52) U.S. Cl.
CPC .............. *H01L 33/22* (2013.01); *H01L 33/005* (2013.01); *H01L 33/12* (2013.01); *H01L 33/32* (2013.01); *H01L 21/0242* (2013.01); *H01L 21/0243* (2013.01); *H01L 33/007* (2013.01)

(58) Field of Classification Search
CPC ..... H01L 33/22; H01L 33/007; H01L 33/002; H01L 33/12
USPC ................................................ 438/29; 257/76
See application file for complete search history.

(56) References Cited

U.S. PATENT DOCUMENTS

| 8,895,331 B2 * | 11/2014 | Lee .................................. 438/27 |
| 2004/0037503 A1 * | 2/2004 | Hastings ................. G02B 6/124 385/37 |
| 2013/0214255 A1 * | 8/2013 | Hermes ............... H01L 51/5221 257/40 |
| 2015/0008474 A1 * | 1/2015 | van den Brand .... H01L 51/5212 257/99 |
| 2015/0123152 A1 * | 5/2015 | Lin ....................... H01L 33/002 257/95 |
| 2015/0359056 A1 * | 12/2015 | Song ..................... H05B 33/089 315/186 |

* cited by examiner

*Primary Examiner* — David S Blum
(74) *Attorney, Agent, or Firm* — Muncy, Geissler, Olds & Lowe, P.C.

(57) ABSTRACT

The present invention relates to a patterned opto-electrical substrate, comprising a substrate, the substrate has a first patterned structure, a spacer region and a second patterned structure, wherein the second patterned structure is formed on one or both of the first patterned structure and the spacer region, and the first patterned structure is a micron-scale protruding structure or a micron-scale recessing structure, while the second patterned structure is a submicron-scale recessing structure. The present invention also relates to a method for manufacturing the aforementioned patterned opto-electrical substrate and light emitting diodes having the aforementioned patterned opto-electrical substrate.

14 Claims, 7 Drawing Sheets

PATTERNED OPTO-ELECTRICAL SUBSTRATE AND METHOD FOR MANUFACTURING THE SAME

CROSS REFERENCE TO RELATED APPLICATION

This application claims the benefits of the Taiwan Patent Application Serial Number 102133449, filed on Sep. 16, 2013, the subject matter of which is incorporated herein by reference.

BACKGROUND OF THE INVENTION

1. Field of the Invention

The present invention relates to an opto-electrical patterned substrate and a manufacturing method thereof, and more particularly to a substrate having a first patterned structure of micron-scale and a second patterned structure of submicron-scale, and to a light-emitting diode having the same.

2. Description of Related Art

The development of human's lighting history has come to an era of solid-state lighting, and what is the common goal pursued in the industry of solid-state lighting is to provide a higher light-emitting brightness, cheaper price, longer life, and higher stability, and so on. The most important demand in the lighting market is the brightness of the light-emitting diode. In general, the maximum light output ($L_{max}$) of a light-emitting diode is mainly determined by the external quantum efficiency ($\eta_{ext}$) and the maximum operating current ($I_{max}$), i.e. $L_{max}=\eta_{ext}\times I_{max}$, wherein the external quantum efficiency ($\eta_{ext}$) is determined by the internal quantum efficiency ($\eta_{int}$) and light extraction efficiency ($\eta_{ext}$), i.e. $\eta_{ext}=\eta_{int}\times\eta_{extr}$. Currently, a typical blue light emitting diode has an internal quantum efficiency of 70% or more, but a green light emitting diode has a suddenly dropped internal quantum efficiency of 40% or less. Therefore, there is still a large growing space for improvement in the external quantum efficiency of light emitting diode or the light-emitting brightness of light emitting diode by elevating the internal quantum efficiency and the light extraction efficiency.

The lattice mismatch between GaN and a sapphire substrate is as high as 16%. Therefore, when the sapphire substrate is used as a substrate for GaN epitaxy, a stress may exist inside the GaN film, and various kinds of dislocations may arise. As a result, the GaN film can have a dislocation density up to $10^9$ to $10^{10}$ cm$^{-2}$, seriously deteriorating the quality of the epitaxial film, and the defects usually act as non-radiative recombination centers, resulting in a decreased luminous efficiency. Thus, the key to the technology development of manufacturing the patterned sapphire substrate lies in the reduction of the defect density, to thereby substantially improve the quality of the epitaxial GaN film and increase the brightness. The growth direction of the dislocation of GaN may be changed by growing a GaN film on sidewall of the patterned substrate, such that the dislocations intersect with each other to form stacking fault due a 90° bend, thereby eliminating the defects. In addition, the three-dimensional stress can be released during the epitaxy to reduce the defect formation and the dislocation density inside the film to improve the epitaxial quality. Recent studies also found that the GaN film grown by the patterned sapphire substrate may have a reduced dislocation defect density of $10^8$ to $10^9$ cm$^{-2}$, further enhancing the internal quantum efficiency and brightness of the light-emitting diode.

In the latest studies, a submicron-scale patterned substrate is also used to grow a light-emitting diode structure. For the patterned substrates with the same area, a reduced pattern size and an increased pattern number will increase the effective area of the lateral growth, thereby improving the lateral growth mechanism. This allows an easier way to change the growth direction and the formation of stacking fault, to eliminate the dislocation defect and significantly reduce the dislocation density inside the film. Also, because of the shorter spacing of the pattern, voids are easily formed during the epitaxy of GaN to block the propagation of defects, thereby improving the quality of the GaN epitaxial film. The studies indicate that a GaN film grown by the micron-scale patterned sapphire substrate may has a decreased dislocation density of $10^8$ cm$^{-2}$, and when the patterned substrate is in a submicron-scale, due to the increased level of stress released per unit volume, the dislocation density may be decreased to $10^7$ cm$^{-2}$ or less.

In the prior art, Taiwan Patent No. I396297 discloses a light emitting diode (LED), comprising a substrate having a micro-meter photonic crystal structure formed therein; a nano-scale photonic crystal structure as a buffer layer formed on the micro-meter layer substrate; a first type epitaxy layer formed on the nano-scale photonic crystal structure; a light emitting layer formed on the first type epitaxy layer; a second type epitaxy layer formed on the light emitting layer; a first contact electrode formed on the first type epitaxy layer; and a second contact electrode formed on the second type epitaxy layer.

Also, Taiwan Patent Publication No. 201251113 discloses a manufacturing method of an LED substrate, an LED substrate and a white light LED structure. The main object is to make an LED emit a high luminance white light with good color rendering index. A plurality of protrusions formed on the reflector of substrate have curved surface on their tops, and the protrusions have a bottom width of 2-4 μm, a height of 1.2-1.8 μm, and a spacing between the two adjacent protrusions may be 0.6-3 μm. The plurality of protrusions makes the InGaN epitaxy layer generate an ultraviolet with a 380-410 nm wavelength after electrify. The ultraviolet reflected by the reflector of the substrate and the protrusions stimulate the fluorescent compounds formed by mixing zinc oxide and yttrium aluminum garnet (YAG) to generate complementary light of the ultraviolet. After the ultraviolet and its complementary light are blended, a high luminance white light with good color rendering index is emitted by a package, and the white light can be used in illumination.

However, in the above-mentioned LEDs, the luminous efficiency thereof is mainly improved by forming a nano-scale porous photonic crystal structure or a micron-scale protruding particles on the substrate individually, and there are still inherent limitations on reducing the dislocation density or improving the luminous efficiency by the aforementioned micron-scale or nano-sacle structural design.

In addition, Taiwan Patent Application No. 102111662 filed by the present Applicant discloses a substrate for an opto-electrical device, wherein at least one opto-electrical device is formed on an upper surface of the substrate, characterized in that the upper surface of the substrate has a plurality of micron-scale structures and a plurality of submicron-scale structures to form a roughened surface, wherein the size of the submicron-scale structures is smaller than that of the micron-scale structures. As such, the optical diffusion rate of the substrate and the quality of the epitaxial film material grown on a substrate can be improved, thereby enhancing the light extraction efficiency, and thus enhancing the overall light-emitting brightness of the opto-electrical device. This prior application further provides an opto-electrical device. This prior application filed by the present Applicant uses a combination of the micron-scale structure and the submicron-scale structure to enhance the quality of the epitaxial film or to improve the overall light-emitting brightness of the opto-electrical device.

Therefore, what is urgently needed in the art is to develop a patterned opto-electrical substrate and a light-emitting diode having the same, which can effectively reduce the dislocation defect density of a GaN film and increase the light-emitting efficiency of a light-emitting diode (LED), so as to improve the applicability and value of the light-emitting diode.

SUMMARY OF THE INVENTION

An object of the present invention is to provide a patterned opto-electrical substrate and a manufacturing method thereof, which can improve the epitaxial quality or reduce the dislocation defect density of the GaN film by the pattern design of the substrate surface, and thus provide the light emitting diode with a more excellent luminous efficiency and performance.

To achieve the above object, the present invention provides a method for manufacturing a patterned opto-electrical substrate, comprising following steps: (A) providing a substrate; (B) forming a first patterned structure and a spacer region on a surface of the substrate by a first etching treatment; (C) forming a first metal layer and a second metal layer on surfaces of the first patterned structure and the spacer region on the substrate; (D) forming a second patterned structure on the second metal layer by an anodic aluminum oxide treatment, wherein the second patterned structure is disposed on one or both of the first patterned structure and the spacer region; (E) transferring the second patterned structure down to the first metal layer and parts of the surfaces of the substrate by a second etching treatment; and (F) removing the first metal layer and the second metal layer from the substrate by an acid treatment to form the substrate having the first patterned structure and the second patterned structure.

In the method for manufacturing a patterned opto-electrical substrate of the present invention, in the steps (B) and (E), the first etching treatment or the second etching treatment may be isotropic etching or anisotropic etching, wherein the first etching treatment or the second etching treatment is inductively coupled plasma reactive ion etching (ICP-RIE), chemical etching, dry etching, plasma etching, or laser processing. In addition, in the method for manufacturing a patterned opto-electrical substrate of the present invention, the isotropic etching may be performed by using a chemical etching solution (such as a strong acid) at a high temperature, to form a micron-scale protruding or recessing structure with a specific period. In addition, in the anisotropic etching, a patterned photoresist layer is first formed on the substrate, and then the etching is performed using inductive coupled plasma reactive ion etching (ICP-RIE) technique, so as to selectively remove a part of the substrate. As such, a micron-scale protruding or recessing structure with a specific period can be formed by anisotropic etching as well.

In the method for manufacturing a patterned opto-electrical substrate of the present invention, in the step (B), a first photoresist layer is further provided on a part of the surface of the substrate to allow selective removal of the substrate by the first etching. In addition, in the method for manufacturing a patterned opto-electrical substrate of the present invention, the first patterned structure may be a micron-scale protruding structure or a micron-scale recessing structure, while the spacer region may be a planar structure. In an aspect of the present invention, the first patterned structure may be a micron-scale protruding structure. In another aspect of the present invention, the first patterned structure may be a micron-scale recessing structure.

In the method for manufacturing a patterned opto-electrical substrate of the present invention, in the step (C), the first metal layer or the second metal layer may be formed by coating method, chemical plating method, sputtering method, evaporation method, cathode arc method, or chemical vapor deposition method. Suitable evaporation methods include an electron beam evaporation, a thermal evaporation method, a high frequency evaporation method, or a laser evaporation method, but the present invention is not limited thereto. In the method for manufacturing a patterned opto-electrical substrate of the present invention, the first metal layer is at least one selected from the group consisting of: titanium, chromium, molybdenum, or combinations thereof, and the first metal layer may have a thickness of 1 nm to 1 μm. Furthermore, the second metal layer is aluminum, and the second metal layer have a thickness of 10 nm to 100 μm. In an aspect of the present invention, the first metal layer is titanium.

In the method for manufacturing a patterned opto-electrical substrate of the present invention, in the step (D), a second photoresist layer is further provided on a surface of the second metal layer over the first patterned structure to allow selective removal of a part of the second metal layer over the spacer region by the anodic aluminum oxide treatment. Therefore, the second patterned structure may be formed on the second metal layer over the spacer region, but not on the second metal layer over the first patterned structure. Alternatively, in the step (D), the second photoresist layer may be provided on a surface of the second metal layer over the spacer region to allow selective removal of a part of the second metal layer over the first patterned structure by the anodic aluminum oxide treatment. Therefore, the second patterned structure may be formed on the second metal layer over the first patterned structure, but not on the second metal layer over the spacer region.

In the method for manufacturing a patterned opto-electrical substrate of the present invention, in the step (E), the second patterned structure may be a submicron-scale recessing structure. In addition, in the method for manufacturing a patterned opto-electrical substrate of the present invention, after the step (F), a buffer layer and an opto-electrical device are further provided on the substrate, such that the substrate may be combined with the buffer layer and the opto-electrical device to form a light emitting diode or a solar cell.

Another object of the present invention is to provide a patterned opto-electrical substrate prepared by the above-mentioned method for manufacturing a patterned opto-electrical substrate of the present invention, which can improve the epitaxial quality or reduce the dislocation defect density of the GaN film by the pattern design of the substrate surface to provide the light emitting diode with a more excellent luminous efficiency and performance.

To achieve the above object, the present invention provides a patterned opto-electrical substrate, comprising: a substrate having a first patterned structure, a spacer region and a second patterned structure, wherein the second patterned structure is formed on one or both of the first patterned structure and the spacer region, and the first patterned structure is a micron-scale protruding structure or a micron-scale recessing structure, while the spacer region may be a planar structure, and the second patterned structure is a submicron-scale recessing structure.

In the patterned opto-electrical substrate of the present invention, the first patterned structure or the second patterned structure may have a cone shape, a circular arc shape, a cylindrical shape, a pyramidal shape (such as triangular, or hexagonal pyramid) or a prismatic shape. In an aspect of the present invention, the first patterned structure preferably has a cone shape. In another aspect of the present invention, the second patterned structure preferably has a pyramidal shape. In the patterned opto-electrical substrate of the present invention, the first patterned structure or the second patterned structure may have an inclination angle. The inclination angle may be an angle between the longitudinal and the horizontal planes of the first patterned structure or the second patterned structure, or an angle between the adjacent inclined planes in the first patterned structure or the second patterned structure, for example, an angle between the longitudinal surface and the surface of the spacer region, or an angle between the longitudinal surface and the bottom of the recessing structure, or an angle between the adjacent inclined planes. In an aspect of the present invention, the first patterned structure may have an inclination angle of 0-180 degrees, preferably 10-80 degrees, and more preferably 20-75 degrees. In another aspect of the present invention, the second patterned structure may have an inclination angle of 0-180 degrees, preferably 90-180 degrees, and more preferably 90-150 degrees.

In the patterned opto-electrical substrate of the present invention, the micron-scale protruding structure or the micron-scale recessing structure may have a height of 1 μm to 5 μm, and preferably 1.2 μm to 2 μm. In addition, the micron-scale recessing structure may have a depth of 1 μm to 5 μm, and preferably 1.2 μm to 2 μm. In the patterned opto-electrical substrate of the present invention, the first patterned structure may have an outer diameter of 1 μm to 5 μm. Furthermore, a spacing between the two adjacent first patterned structures may be 0.1 μm to 5 μm, and preferably 0.3 μm to 1 μm, wherein the spacing between the two adjacent first patterned structures is the length or width of the spacer region, and the spacer region is a planar surface provided for the epitaxial growth.

In the patterned opto-electrical substrate of the present invention, the second patterned structure may have a depth of 10 nm to 10 μm and an outer diameter of 20 nm to 950 nm, wherein the depth (e.g. 10 μm) of the second patterned structure is greater than the height or depth (e.g. 5 μm) of the first patterned structure. This is mainly because that the epitaxial layer of a typical light emitting diode has a thickness of about 5 μm, and therefore the height or depth of the first patterned structure should be less than the thickness of the epitaxial layer to allow the epitaxial layer to have a flat light emitting surface. However, the second patterned structure may penetrate through a part of the first patterned structure according to the application needs, or the second patterned structure may penetrate through the entirety of the first patterned structure and be transferred to the substrate. Therefore, the depth of the second patterned structure does not need to be limited to the thickness of the epitaxial layer. In addition, a number of the second patterned structure on the first patterned structure is $1 \times 10^8$ to $2.5 \times 10^{11}$ cm$^{-2}$. For example, provided that the shape of the first patterned structure is tetragonal prism and the spacing of the second patterned structure is not taken into consideration, the aforementioned first patterned structure may have a length of 5 μm, and the second patterned structure may has an outer diameter of 20 nm. Therefore, there may be about 62,500 the second patterned structures over the first patterned structure of 25 μm square. However, since the first patterned structure is a non-planar protruding or recessing structure, compared to the theoretical value calculated from the planar structure, the first patterned structure of the non-planar structure may have a greater area and contain a greater number of the second patterned structure.

Another object of the present invention is to provide a light emitting diode having a patterned opto-electrical substrate, wherein the above-described patterned opto-electrical substrate is served as the substrate of the light emitting diode, which can improve the epitaxial quality or reduce the dislocation defect density of the GaN film by the pattern design of the substrate surface to provide the light emitting diode with a more excellent luminous efficiency and performance.

To achieve the above object, the present invention provides a light emitting diode having a patterned opto-electrical substrate, comprising: a substrate which is the above-described opto-electrical substrate; a buffer layer disposed on the substrate; and an opto-electrical device disposed on the buffer layer, and the opto-electrical device containing a first semiconductor layer, a light emitting layer, and a second semiconductor layer, wherein the first semiconductor layer is connected to the buffer layer, and the light emitting layer is sandwiched between the first semiconductor layer and the second semiconductor layer. In this case, the first semiconductor layer and the second semiconductor layer have the opposite conductivity type, for example, the first semiconductor layer and the second semiconductor layer are a P-type semiconductor layer and an N-type semiconductor layer respectively, or the first semiconductor layer and the second semiconductor layer are an N-type semiconductor layer and a P-type semiconductor layer respectively. Furthermore, the light emitting diode having a patterned opto-electrical substrate of the present invention may further include a first electrode and a second electrode, wherein the first electrode and the second electrode are electrically connected to the first semiconductor layer and the second semiconductor layer respectively, and the first electrode and the first semiconductor layer or the second electrode and the second semiconductor layer have the same conductivity type, for example, the first electrode and the first semiconductor layer are positively charged, and the second electrode and the second semiconductor layer are negatively charged. Alternatively, the first electrode and the first semiconductor layer are negatively charged, and the second electrode and the second semiconductor layer are positively charged. In addition, in the light emitting diode having a patterned opto-electrical substrate of the present invention, the opto-electrical device may be a straight-through light emitting diode, a by-pass light emitting diode, or a flip-chip light-emitting diode, but the present invention is not limited thereto.

Furthermore, in the light emitting diode having a patterned opto-electrical substrate of the present invention, the buffer layer may be a gallium nitride (GaN), aluminum nitride (AlN), aluminum gallium nitride (AlGaN), or the like, or combinations thereof, in order to reduce the stress caused by a lattice mismatch between the substrate (e.g. a sapphire substrate) and the opto-electrical device (e.g. a GaN epitaxial layer of a light-emitting diode), thereby achieving the reduction in the number of defects within the opto-electrical device. In addition to the use of the GaN epitaxial layer as the opto-electrical device to form a light emitting diode, in another aspect of the present invention, a solar cell substrate is further used as the opto-electrical device to form a solar cell. In this case, the buffer layer may be an amorphous silicon carbide to reduce the stress caused by a lattice mismatch between the substrate (e.g. a sapphire substrate) and the solar cell single crystalline layer or the solar cell polycrystalline layer, thereby achieving the reduction in the number of defects within the opto-electrical device, but the invention is not limited thereto.

In the light emitting diode having a patterned opto-electrical substrate of the present invention, the substrate may have a first patterned structure, a spacer region and a second patterned structure, wherein the second patterned structure may be formed on one or both of the first patterned structure and the spacer region, and the first patterned structure may be a micron-scale protruding structure or a micron-scale recessing structure, and the spacer region may be a planar structure, while the second patterned structure may be a submicron-scale recessing structure.

Because of the lattice mismatch structure between the GaN and the sapphire substrate, various kinds of dislocations will be present in the GaN film, such that the GaN film has a dislocation density of up $10^{10}$ cm$^{-2}$, seriously degrading the quality of the epitaxial film. Therefore, in the present invention, the growth direction of the dislocation of GaN may be changed by growing the GaN film on the sidewall of the patterned substrate (such as on the side surface of the micron-scale protruding structure or the micron-scale recessing structure of the first patterned structure, or on the side surface of the submicron-scale recessing structure of the second patterned structure), such that the dislocations intersect with each other to form stacking fault, thereby eliminating the defect. Also, voids may be formed in the submicron-scale recessing structure of the second patterned structure, thereby reducing the dislocation density inside the film to improve the crystal quality, wherein the micron-scale patterned opto-electrical substrate may be employed to reduce the dislocation density of opto-electrical device down to $10^8$ cm$^{-2}$, and the submicron-scale patterned opto-electrical substrate may be employed to reduce the dislocation density of opto-electrical device down to $10^7$ cm$^{-2}$ or lower.

In the light emitting diode having a patterned opto-electrical substrate of the present invention, the opto-electrical device may have a dislocation density of $10^7$ cm$^{-2}$ or less. In an aspect of the present invention, the opto-electrical device may have a dislocation density of $10^6$ cm$^{-2}$ to $10^7$ cm$^{-2}$. In another aspect of the present invention, the opto-electrical device may have a dislocation density of $10^5$ cm$^{-2}$ to $10^6$ cm$^{-2}$.

The present invention further proposes to use the spectrometer with an integrating sphere to measure the optical characteristics of the patterned substrate, and the pattern dimension (an outer diameter, a height or depth, and a spacing) of the patterned substrate is designed depending on two optical parameters: the total reflectance (a sum of a mirror reflectance and a diffuse reflectance) and the diffuse reflectance. In general, the patterned substrate with a higher diffuse reflectance may substantially improve the extraction efficiency of the light-emitting diode light. In the light emitting diode having a patterned opto-electrical substrate of the present invention, the total reflectance of the substrate may be arbitrarily changed according to the structure design of the first patterned structure or the second patterned structure, for example, alternation of the depth, height, outer diameter and spacing of the first patterned structure, or alternation of the depth or outer diameter of the second patterned structure, wherein the substrate may have a total reflectance of 30% or more, preferably 40% or more, more preferably 90% to 100%, and most preferably close to 100%. Furthermore, in the light emitting diode having a patterned opto-electrical substrate of the present invention, the diffuse reflectance of the substrate may be arbitrarily changed according to the structure design of the first patterned structure or the second patterned structure, for example, alternation of the depth, height, outer diameter and spacing of the first patterned structure, or alternation of the depth or outer diameter of the second patterned structure, wherein the substrate may have a diffuse reflectance of 35% or more, preferably 50% or more, more preferably 90% to 100%, and most preferably close to 100%.

Compared with the typical micron-scale patterned substrate, the substrate with both micron-scale and submicron-scale patterned structures according to the present invention may significantly improve the total reflectance and diffuse reflectance of the substrate with both micron-scale patterned structures. Also, compared with the non-patterned flat substrate, the substrate with both micron-scale and submicron-scale patterned structures according to the present invention may further significantly improve the total reflectance and diffuse reflectance of the non-patterned substrate. Accordingly, the substrate with both micron-scale and submicron-scale patterned structures according to the present invention may effectively improve the total reflectance and diffuse reflectance of the substrate, and help enhance the light extraction efficiency of the light-emitting diode, thus increasing the brightness of the light-emitting diode.

In summary, the patterned opto-electrical substrate, the manufacturing method thereof, and the light emitting diode having the patterned opto-electrical substrate according to the present invention can improve the epitaxial quality or reduce the dislocation defect density of the GaN film by the pattern design of the substrate surface, and thus the light emitting diode can have a more excellent luminous efficiency and performance.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1A:
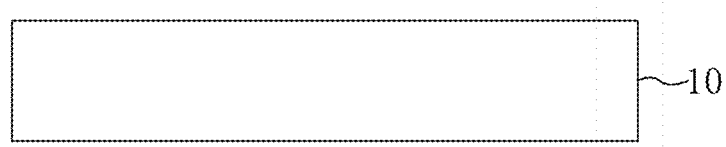
FIGS. 1A to 1H show the process flow for manufacture of the patterned opto-electrical substrate according to Example 1 of the present invention.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Example 1

Refer to FIGS. 1A to 1H, which show the process flow for manufacture of the patterned opto-electrical substrate according to Example 1 of the present invention. First, referring to FIGS. 1A and 1B, a substrate 10 is provided. The substrate 10 is a sapphire substrate or a silicon substrate with a planar surface, and a first patterned structure 11 and a spacer region 12 are formed on a surface of the substrate 10 by a first etching treatment. In the first etching treatment, a first photoresist layer (not shown) is further disposed on a part of the surface of the substrate 10, so as to selectively remove a part of the substrate 10 by the first etching treatment, to form the micron-scale protruding first patterned structure 11 having a cone shape and the spacing region 12 of a planar structure. The first patterned structure 11 (i.e., the micron-scale protruding structure) has a height of 1.2 μm to 2 μm, an outer diameter of 1 μm to 5 μm, and a spacing between the two adjacent first patterned structures 11 (i.e., the length or width of the spacer region 12) is 0.3 μm to 1 μm.

Figure 1B:
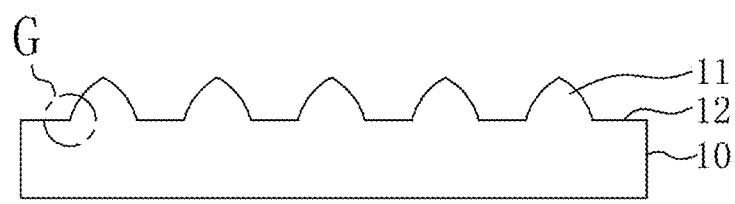
Figure 1C:
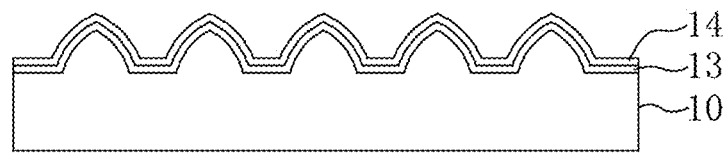

Next, referring to FIG. 1C, a first metal layer 13 and a second metal layer 14 are formed sequentially on the surfaces of the first patterned structure 11 and the spacer region 12 over the substrate 10, wherein the first metal layer 13 or the second metal layer 14 is formed on the surfaces of the first patterned structure 11 and the spacer region 12 over the substrate 10 by an electron beam evaporation method. The first metal layer 13 is a titanium layer having a thickness of 1 nm to 1 μm, and the second metal layer 14 is an aluminum layer having a thickness of 10 nm to 100 μm.

Figure 1D:
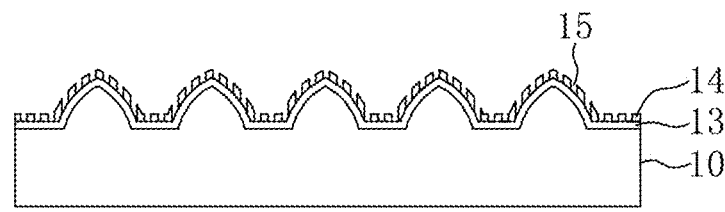
Figure 1E:
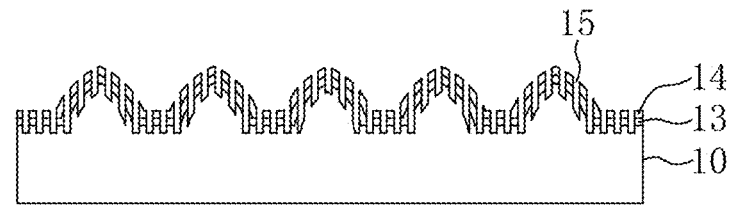
Figure 6A:
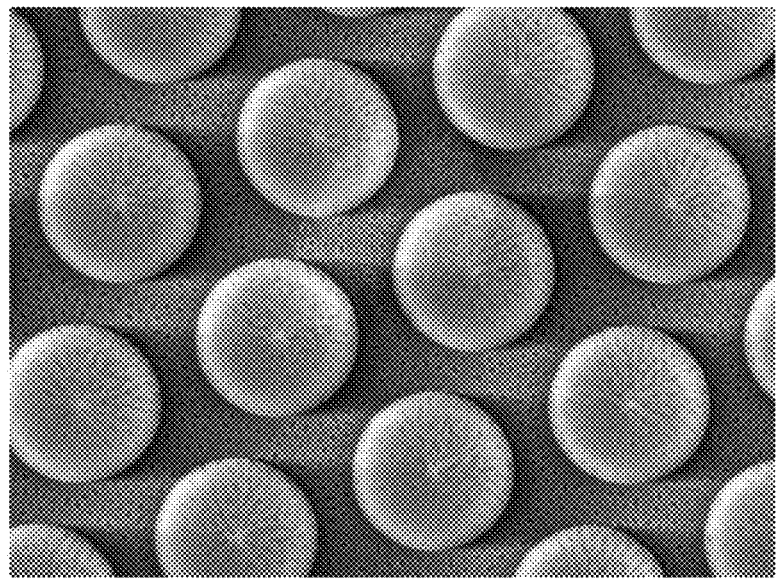
FIGS. 6A and 6B show the scanning electron microscopy images of the patterned opto-electrical substrate according to Example 1 of the present invention.

Then, referring to FIG. 1D, a second patterned structure 15 is formed on the second metal layer 14 by an anodic aluminum oxide treatment, and the second patterned structure 15 is disposed on both of the first patterned structure 11 and the spacer region 12. Please also refer to the scanning electron microscopy image of the patterned opto-electrical substrate as shown in FIG. 6A. The second patterned structure 15 is transferred from the second metal layer 14 down to the first metal layer 13 and parts of the surfaces of the substrate 10 by a second etching treatment, as shown in FIG. 1E. Finally, the first metal layer 13 and the second metal layer 14 are removed from the substrate 10 by an acid treatment to form the patterned opto-electrical substrate 10 having the first patterned structure 13 and the second patterned structure 14. The second patterned structure 15 is a sub-micron-scale recessing structure of a pyramidal shape having a depth of 10 nm to 10 μm, an outer diameter of 20 nm to 950 nm, such that the number of the second patterned structure 15 on the first patterned structure 11 is $1 \times 10^8$ to $2.5 \times 10^{11}$ cm$^{-2}$.

During the formations of the aforementioned first patterned structure 11 and the second patterned structure 15, the first etching treatment or the second etching treatment may be isotropic etching or anisotropic etching, for example, inductively coupled plasma reactive ion etching (ICP-RIE), chemical etching, dry etching, plasma etching, or laser processing. In Example 1, the first patterned structure 11 is formed by the first etching treatment using the inductively coupled plasma reactive ion anisotropic etching, and then the second patterned structure 15 is formed on the second metal layer 14 by an anodic aluminum oxide treatment. After that, the second patterned structure 15 is transferred from the second metal layer 14 down to the first metal layer 13 and parts of the surfaces of the substrate 10 by a second etching treatment using the inductively coupled plasma reactive ion anisotropic etching. Furthermore, in the aforementioned first etching treatment, in addition to using the inductively coupled plasma reactive ion anisotropic etching to form the first patterned structure 11 having a conical shape, the chemical isotropic etching can also be used to form the first patterned structure 11 having a hexagonal pyramid shape.

Figure 1F:
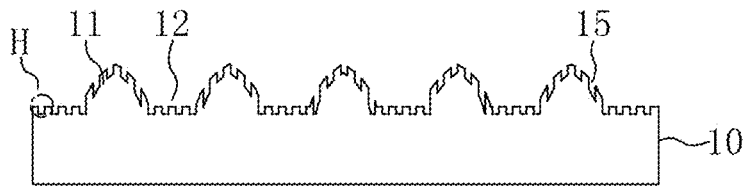
Figure 1G:
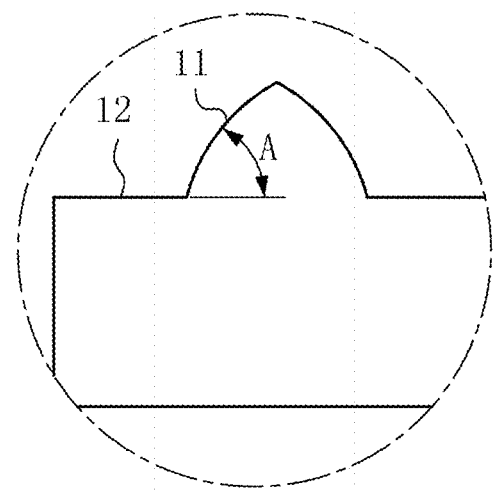
Figure 1H:
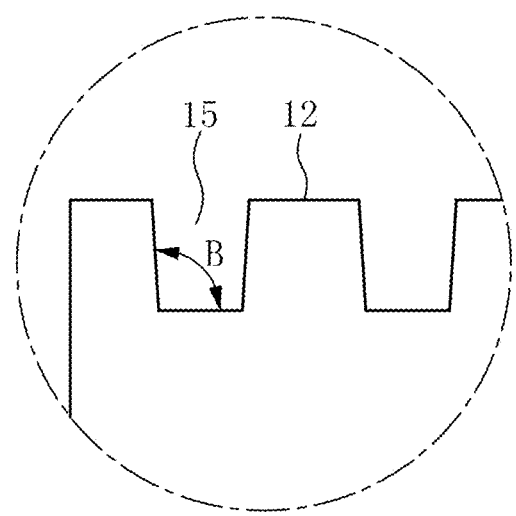

Further, as shown in FIG. 1G, an angle A between the longitudinal and the horizontal planes of the first patterned structure 11 (please also refer to the position G indicated in FIG. 1B), i.e., the first patterned structure 11 has an inclination angle of 20 degrees to 75 degrees. As shown in FIG. 1H, an angle B between the longitudinal and the horizontal planes of the second patterned structure 15 (please also refer to the position H indicated in FIG. 1F), i.e., the second patterned structure 15 has an inclination angle of 90 degrees to 150 degrees.

Example 2

Figure 2:
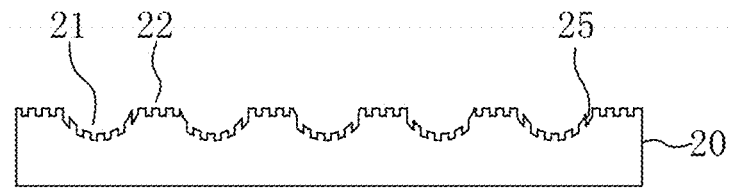
FIG. 2 shows the schematic diagram of the patterned opto-electrical substrate according to Example 2 of the present invention.

Refer to FIG. 2, which shows the schematic diagram of the patterned opto-electrical substrate according to Example 2 of the present invention. The patterned opto-electrical substrate and the manufacturing process thereof in Example 2 are substantially the same as in Example 1, except for the concave-convex profiles of the first patterned structures. Unlike Example 1, wherein the first patterned structure is the micron-scale protruding structure having a cone-shape (please also refer to FIG. 1B), in Example 2, a first photoresist layer (not shown) is provided on a part of the surface of the substrate 20, so as to selectively remove a part of the substrate 20 by the first etching treatment, to form the micron-scale recessing first patterned structure 21 having a cone shape and the spacing region 22 of a planar structure. Then, the same manufacturing process as in Example 1 is performed to provide the first patterned structure 21 with a plurality of the second patterned structure 25, thus forming the patterned opto-electrical substrate 20 having the first patterned structure 21 and the second patterned structure 25.

Examples 3 to 5

Figure 3A:
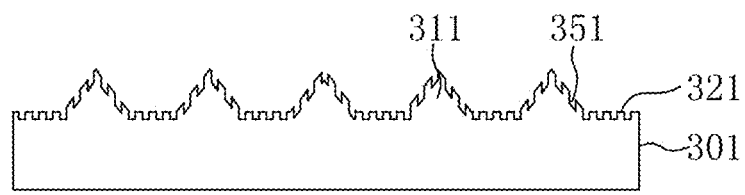
FIGS. 3A to 3C show the schematic diagrams of the patterned opto-electrical substrates according to Examples 3-5 of the present invention.
Figure 3B:
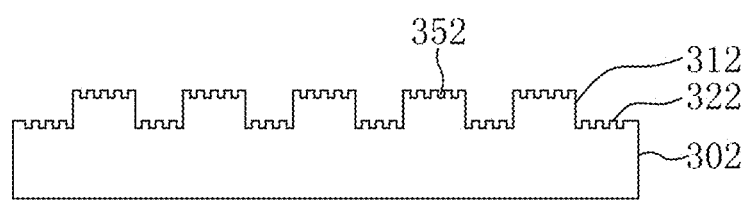
Figure 3C:
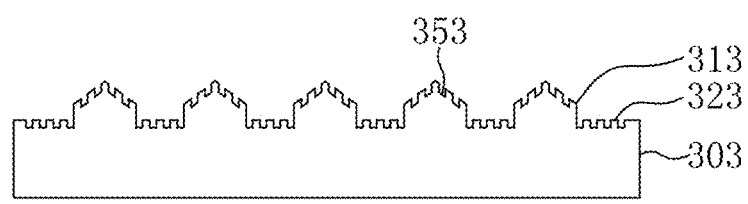

Refer to FIG. 3A to 3C, which show the schematic diagrams of the patterned opto-electrical substrates according to Examples 3-5 of the present invention. The patterned opto-electrical substrate and the manufacturing process thereof in Examples 3-5 are substantially the same as in Example 1, except for the shapes of the first patterned structures.

Unlike Example 1, wherein the first patterned structure is the micron-scale protruding structure having a cone-shape (please also refer to FIG. 1B), referring to FIG. 3A, in Example 3, a first photoresist layer (not shown) is provided on a part of the surface of the substrate 301, so as to selectively remove a part of the substrate 301 by the first etching treatment, to form the micron-scale protruding first patterned structure 311 having a shape of triangular pyramid and the spacing region 321 of a planar structure. Then, the same manufacturing process as in Example 1 is performed to provide the first patterned structure 311 with a plurality of the second patterned structure 351, thus forming the patterned opto-electrical substrate 301 having the first patterned structure 311 and the second patterned structure 351.

Referring to FIG. 3B, in Example 4, a first photoresist layer (not shown) is provided on a part of the surface of the substrate 302, so as to selectively remove a part of the substrate 302 by the first etching treatment, to form the micron-scale protruding first patterned structure 312 having a shape of quadrangular prism and the spacing region 322 of a planar structure. Then, the same manufacturing process as in Example 1 is performed to provide the first patterned structure 312 with a plurality of the second patterned structure 352, thus forming the patterned opto-electrical substrate 302 having the first patterned structure 312 and the second patterned structure 352.

Referring to FIG. 3C, in Example 5, a first photoresist layer (not shown) is provided on a part of the surface of the substrate 303, so as to selectively remove a part of the substrate 303 by the first etching treatment, to form the micron-scale protruding first patterned structure 313 having a shape of pentagonal prism (i.e. a combination of triangular pyramid and quadrangular prism) and the spacing region 323 of a planar structure. Then, the same manufacturing process as in Example 1 is performed to provide the first patterned structure 313 with a plurality of the second patterned structure 353, thus forming the patterned opto-electrical substrate 303 having the first patterned structure 313 and the second patterned structure 353.

Examples 6 and 7

Figure 4A:
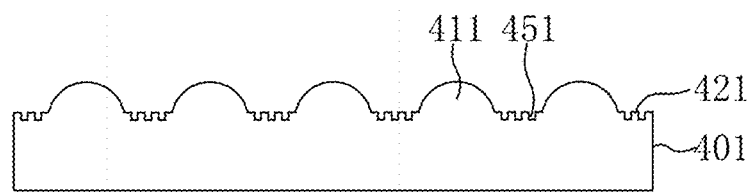
FIGS. 4A and 4B show the schematic diagrams of the patterned opto-electrical substrates according to Examples 6-7 of the present invention.
Figure 4B:
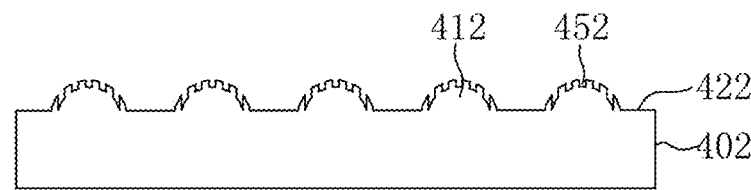

Refer to FIGS. 4A and 4B, which show the schematic diagram of the patterned opto-electrical substrate according to Examples 6 and 7 of the present invention. The patterned opto-electrical substrate and the manufacturing process thereof in Examples 6 and 7 are substantially the same as those in Example 1, except for the distribution location of the second patterned structures.

Unlike Example 1, wherein the second patterned structure are on both of the first patterned structure and the spacer region, referring to FIG. 4A, in Example 6, a second photoresist layer (not shown) is disposed on the surface of the second metal layer (not shown) over the first patterned structure 411, so as to selectively remove a part of the second metal layer over the spacer region 421 by an anodic aluminum oxide treatment. Then, the same manufacturing process as in Example 1 is performed to form the patterned opto-electrical substrate 401 having the first patterned structure 411 and the second patterned structure 451, wherein the second patterned structure 451 is not present on the first patterned structure 411, but only present on the spacer region 421.

Referring to FIG. 4B, in Example 7, a second photoresist layer (not shown) is disposed on the surface of the second metal layer (not shown) over the spacer region 422, so as to selectively remove a part of the second metal layer over the first patterned structure 412 by an anodic aluminum oxide treatment. Then, the same manufacturing process as in Example 1 is performed to form the patterned opto-electrical substrate 402 having the first patterned structure 412 and the second patterned structure 452, wherein the second patterned structure 452 is not present on the spacer region 422, but only on the first patterned structure 412.

Example 8

Figure 5:
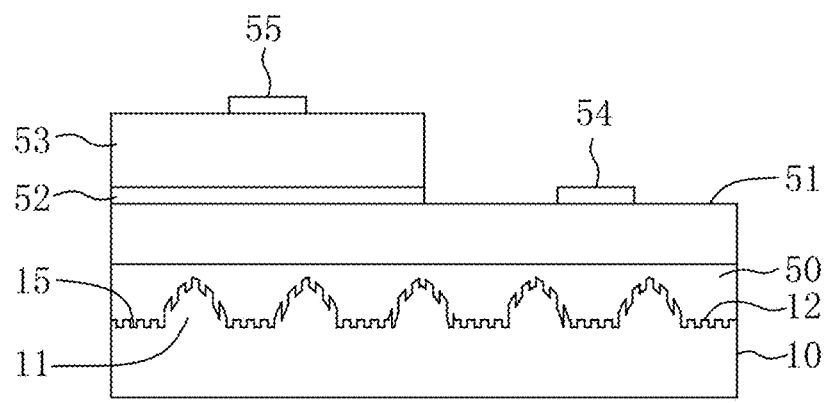
FIG. 5 shows the schematic diagram of the light emitting diode having the patterned opto-electrical substrate according to Example 8 of the present invention.

Refer to FIG. 5, which shows the schematic diagram of the light emitting diode having the patterned opto-electrical substrate according to Example 8 of the present invention. A buffer layer and an opto-electrical device are formed on the above-mentioned patterned opto-electrical substrate of Example 1 to form a light emitting diode.

Referring to FIG. 5, in Example 8, the light emitting diode comprises a substrate 10 which is the above-mentioned patterned opto-electrical substrate of Example 1; a buffer layer 50, which may be a gallium nitride layer, disposed on the substrate 10, to improve the stress and defect generated by the lattice mismatch between the substrate 10 and opto-electrical device; and an opto-electrical device disposed on the buffer layer 50, and the opto-electrical device comprises a first semiconductor layer 51, a light emitting layer 52, and a second semiconductor layer 53, wherein the first semiconductor layer 51 is connected to the buffer layer 50, and the light emitting layer 52 is sandwiched between the first semiconductor layer 51 and the second semiconductor layer 53.

The substrate 10 has the first patterned structure 11, the spacer region 12 and the second patterned structure 15, and the second patterned structure 15 is formed on both of the first patterned structure 11 and the spacer region 12, and the first patterned structure 11 is a micron-scale protruding structure while the second patterned structure 15 is a submicron-scale recessing structure. In addition, the light emitting diode comprises a first electrode 54 and a second electrode 55, and the first electrode 54 and the second electrode 55 are electrically connected to the first semiconductor 51 and the second semiconductor layer 53 respectively.

Test Example 1

Figure 6B:
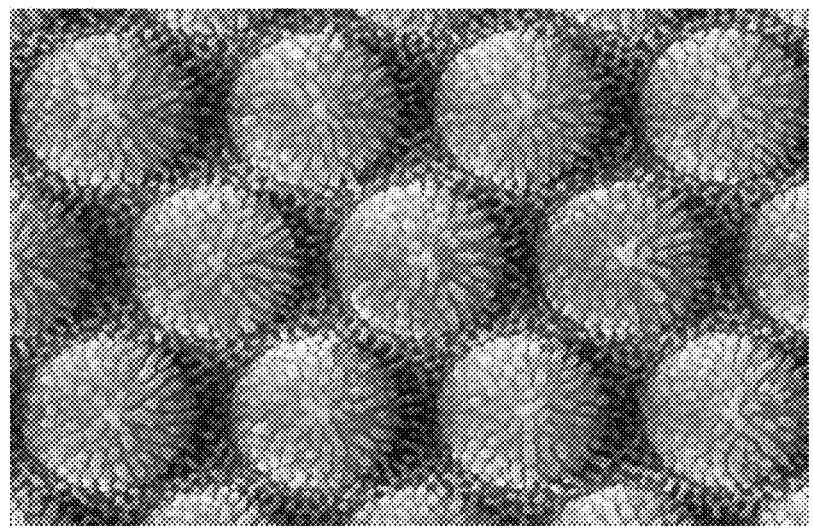

Please refer to FIGS. 6A and 6B, which show the scanning electron microscopy images of the patterned opto-electrical substrate according to Example 1 of the present invention, wherein in FIGS. 6A and 6B, the second patterned structure was formed on the second metal layer by using anodic aluminum oxide treatment solutions of different formulations. Referring to FIG. 1C in conjunction with FIG. 1F, in Example 1, a second patterned structure 15 was formed on the second metal layer 14 by an anodic aluminum oxide treatment, and the second patterned structure 15 was transferred from the second metal layer 14 down to the first metal layer 13 and parts of the surfaces of the substrate 10 by a second etching treatment. Finally, the first metal layer 13 and the second metal layer 14 were removed from the substrate 10 by an acid treatment solution, to form the patterned opto-electrical substrate 10 having the first patterned structure 11 and the second patterned structure 15, wherein the acid treatment solution was prepared from hydrofluoric acid, nitric acid and acetic acid in a specific ratio (e.g., hydrofluoric acid:nitric acid:acetic acid=2:3:10), and acid washing was performed for 2 minutes.

FIG. 6A shows the scanning electron microscopy image of the patterned opto-electrical substrate according to Example 1 of the present invention, wherein 0.3M of an oxalic acid solution was used as the electrolyte for the anodic aluminum oxide treatment, to form a second patterned structure on the second metal layer, and then, the second patterned structure having an outer diameter of 20 nm to 120 nm and a depth of 150 nm was formed on the substrate sequentially by an inductively coupled plasma reactive ion etching and an acid treatment. FIG. 6B shows the scanning electron microscopy image of another patterned opto-electrical substrate according to Example 1 of the present invention, wherein a phosphoric acid solution was used as the electrolyte for the anodic aluminum oxide treatment, to form a second patterned structure on the second metal layer, and then, the second patterned structure having an outer diameter of 80 nm to 250 nm and a depth of 150 nm was formed on the substrate sequentially by an inductively coupled plasma reactive ion etching and an acid treatment. The results of the scanning electron microscopy images of the patterned opto-electrical substrates in FIGS. 6A and 6B indicate that when the oxalic acid solution was used as the electrolyte for the anodic aluminum oxide treatment, the second patterned structure having a smaller outer diameter was provided, while on the other hand, when the phosphoric acid solution was used as the electrolyte for the anodic aluminum oxide treatment, the second patterned structure having a larger outer diameter was provided.

Test Example 2

Figure 7A:
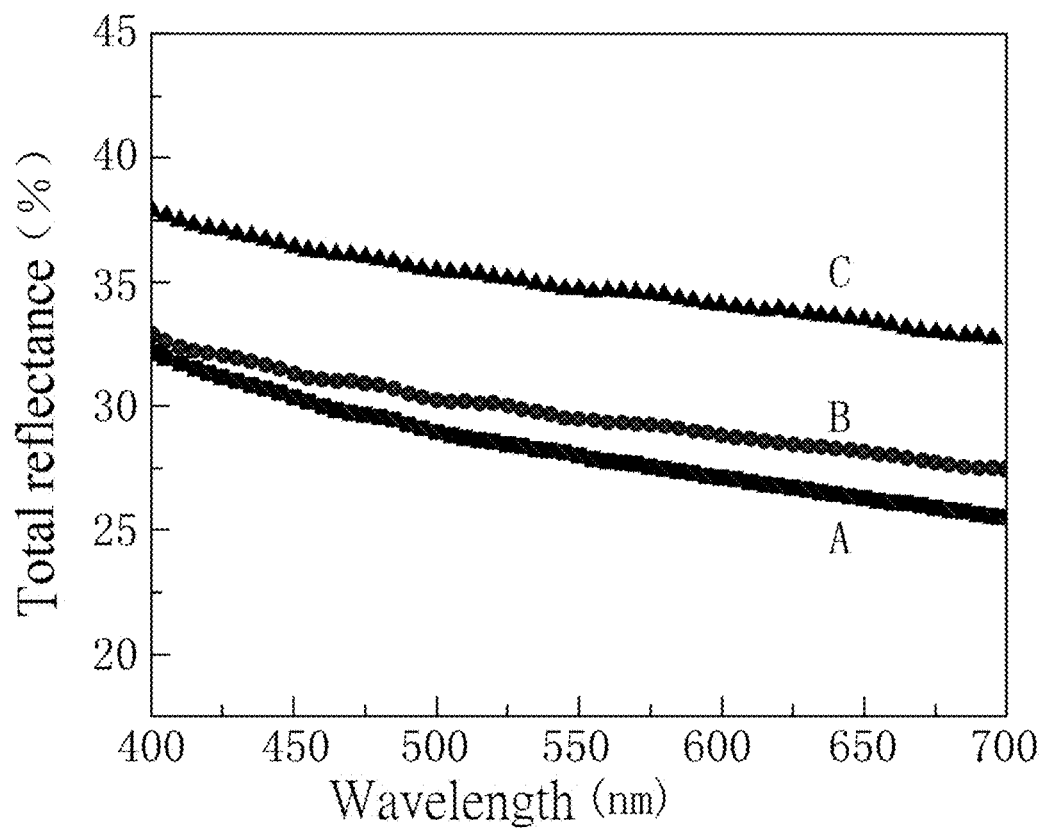
FIGS. 7A and 7B show the comparison chart of the total reflectance and diffuse reflectance of the substrate according to Example 1 of the present invention.
Figure 7B:
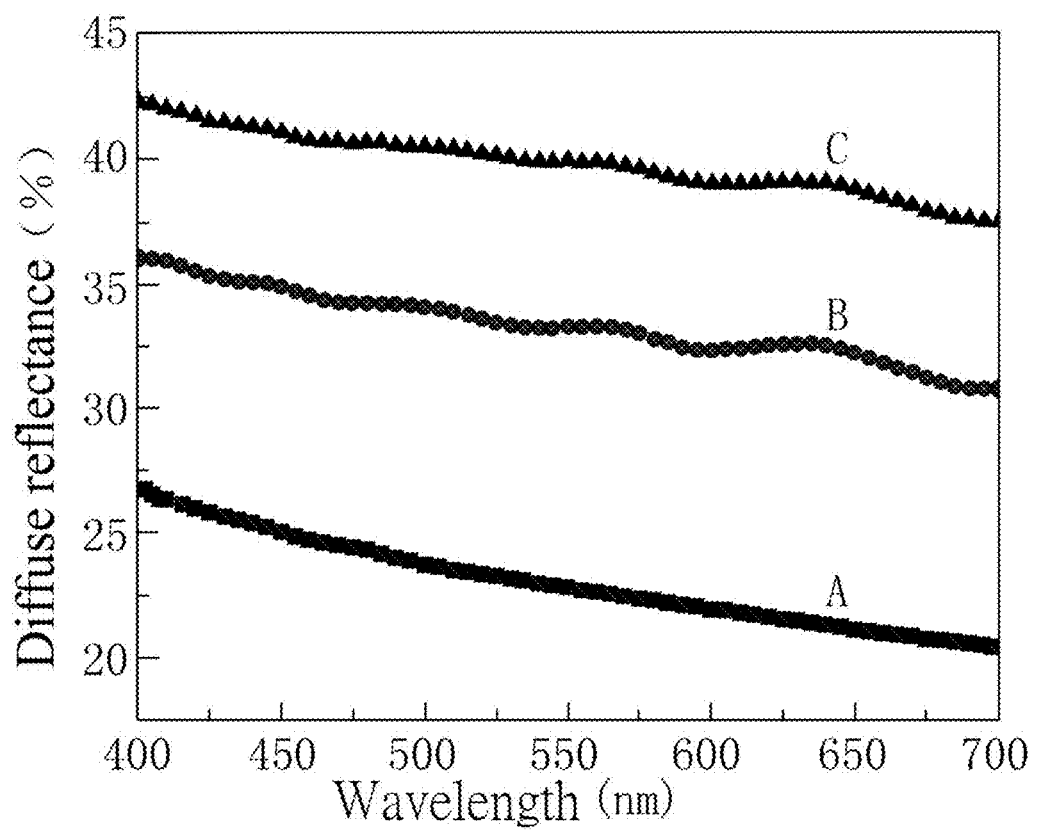

Please refer to FIGS. 7A and 7B, which show the comparison chart of the total reflectance and diffuse reflectance of the substrate according to Example 1 of the present invention, wherein a spectroscopy was used for the measurement of optical properties (the total reflectance and the diffuse reflectance) of the sapphire substrate having both micron-scale and submicron-scale patterned structures in a wavelength of 400 nm to 700 nm, and the obtained results was compared with that of the substrate having a non-patterned structure or the substrate only having the micron-scale patterned structure. In FIGS. 7A and 7B, the curve A to the curve C represent the total reflectance and the diffuse reflectance of the substrates having different structure, respectively, wherein the curve A shows the non-patterned substrate (e.g., the flat substrate as shown in FIG. 1A), the curve B shows the micron-scale patterned substrate (e.g., the structure having the first patterned structure as shown in FIG. 1B), and the curve C represents the substrate having both micron-scale and submicron-scale patterned structures (e.g., the substrate having both of the first and second patterned structures as shown in FIG. 1F).

Referring to FIG. 7A, in terms of the total reflection, the curve A had an average total reflectance of 28.27%, the curve B had an average total reflectance of 29.72%, and the curve C had an average total reflectance of 34.91%. This experimental results indicate that the micron-scale patterned substrate (the curve B) may improve the average total reflectance of the non-patterned substrate (curve A) from 28.27% to 29.72%, that is, the average total reflectance of the non-patterned substrate (curve A) was further increased by 5%. In addition, the substrate having both micron-scale and submicron-scale patterned structures (the curve C) may improve the average total reflectance of the micron-scale patterned substrate (the curve B) from 29.72% to 34.91%, that is, the average total reflectance of the micron-scale patterned substrate (the curve B) was further increased by 17%. Furthermore, the micron-scale patterned substrates having a variety of total reflectance may be used, that is, the average total reflectance may be arbitrarily selected depending on the application needs in the present invention. For example, when a micron-scale patterned substrate having a total reflectance of 80% is selected in combination with the second patterned structure to form the substrate having both of the micron-scale and submicron-scale patterned structures, an increase of the total reflection from 80% to 93.6% can be achieved.

Referring to FIG. 7B, in terms of the diffuse reflectance, the curve A had an average diffuse reflectance of 23.09%, the curve B had an average diffuse reflectance of 33.32%, and the curve C had an average diffuse reflectance of 39.80%. This experimental results indicate that the micron-scale patterned substrate (the curve B) may improve the average diffuse reflectance of the non-patterned substrate (curve A) from 23.09% to 33.32%, that is, the average diffuse reflectance of the non-patterned substrate (curve A) was further increased by 44%. In addition, the substrate having both micron-scale and submicron-scale patterned structures (the curve C) may improve the average diffuse reflectance of the micron-scale patterned substrate (the curve B) from 33.32% to 39.80%, that is, the average diffuse reflectance of the micron-scale patterned substrate (the curve B) was further increased by 19%. Furthermore, the micron-scale patterned substrates having a variety of total diffuse reflectance may be arbitrarily selected depending on the application needs in the present invention. For example, when a micron-scale patterned substrate having a diffuse reflectance of 80% is selected in combination with the second patterned structure to form the substrate having both of the micron-scale and submicron-scale patterned structures, an increase of the total diffuse reflectance from 80% to 95.2% can be achieved.

The experimental results show that the light-emitting diode with the substrates having both micron-scale and submicron-scale patterned structures grown in Test Example 1 by using the anodic aluminum oxide treatment solutions of different formulations (i.e. FIGS. 6A and 6B) exhibited about 8% and 12% increase in the light-emitting brightness compared with the light-emitting diode using the substrate only having the micron-scale patterned structure. Accordingly, the substrate having both micron-scale and submicron-scale patterned structures according to the present invention can effectively enhance the total reflectance and the diffuse reflectance, and help improve the light extraction efficiency of the light-emitting diode, thereby increasing the light emitting brightness of the light-emitting diode.

It should be understood that these examples are merely illustrative of the present invention and the scope of the invention should not be construed to be defined thereby, and the scope of the present invention will be limited only by the appended claims.

What is claimed is:

1. A method for manufacturing a patterned opto-electrical substrate, comprising following steps:
   (A) providing a substrate;
   (B) forming a first patterned structure and a spacer region on a surface of the substrate by a first etching treatment;
   (C) forming a first metal layer and a second metal layer on surfaces of the first patterned structure and the spacer region on the substrate;
   (D) forming a second patterned structure on the second metal layer by an anodic aluminum oxide treatment, wherein the second patterned structure is disposed on one or both of the first patterned structure and the spacer region;
   (E) transferring the second patterned structure down to the first metal layer and parts of the surfaces of the substrate by a second etching treatment; and
   (F) removing the first metal layer and the second metal layer from the substrate by an acid treatment to form the substrate having the first patterned structure and the second patterned structure.

2. The method for manufacturing a patterned opto-electrical substrate of claim 1, wherein, in the steps (B) and (E), the first etching treatment or the second etching treatment is isotropic etching or anisotropic etching.

3. The method for manufacturing a patterned opto-electrical substrate of claim 1, wherein, in the steps (B) and (E), the first etching treatment or the second etching treatment is inductively coupled plasma reactive ion etching, chemical etching, dry etching, plasma etching, or laser processing.

4. The method for manufacturing a patterned opto-electrical substrate of claim 1, in the step (B), further comprising providing a first photoresist layer on a part of the surface of the substrate, so as to selectively remove a part of the substrate by the first etching treatment.

5. The method for manufacturing a patterned opto-electrical substrate of claim 1, wherein, in the step (B), the first patterned structure is a micron-scale protruding structure or a micron-scale recessing structure.

6. The method for manufacturing a patterned opto-electrical substrate of claim 1, wherein, in the step (C), the first metal layer or the second metal layer is formed by coating method, chemical plating method, sputtering method, evaporation method, cathode arc method, or chemical vapor deposition method.

7. The method for manufacturing a patterned opto-electrical substrate of claim 1, wherein, in the step (C), the first metal layer is at least one selected from the group consisting of: titanium, chromium, molybdenum, or combinations thereof, and the first metal layer has a thickness of 1 nm to 1 μm.

8. The method for manufacturing a patterned opto-electrical substrate of claim 1, wherein, in the step (C), the second metal layer is aluminum having a thickness of the 10 nm to 100 μm.

9. The method for manufacturing a patterned opto-electrical substrate of claim 1, in the step (D), further comprising: providing a second photoresist layer on a surface of the second metal layer over the first patterned structure, so as to selectively remove a part of the second metal layer over the spacer region by the anodic aluminum oxide treatment.

10. The method for manufacturing a patterned opto-electrical substrate of claim 1 or 9, wherein the second patterned structure is formed on the second metal layer over the spacer region.

11. The method for manufacturing a patterned opto-electrical substrate of claim 1, in the step (D), further comprising: providing the second photoresist layer on a surface of the second metal layer over the spacer region, so as to selectively remove a part of the second metal layer over the first patterned structure by the anodic aluminum oxide treatment.

12. The method for manufacturing a patterned opto-electrical substrate of claim 1, wherein the second patterned structure is formed on the second metal layer over the first patterned structure.

13. The method for manufacturing a patterned opto-electrical substrate of claim 1, wherein, in the step (E), the second patterned structure is a submicron-scale recessing structure.

14. The method for manufacturing a patterned opto-electrical substrate of claim 1, after the step (F), further comprising: providing a buffer layer and an opto-electrical device on the substrate.

* * * * *